(12) United States Patent
Yang et al.

(10) Patent No.: US 6,666,261 B2
(45) Date of Patent: Dec. 23, 2003

(54) LIQUID CIRCULATION COOLER

(75) Inventors: Chih-Hao Yang, Taipei (TW); Timin Zhang, Shenzhen (CN)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 97 days.

(21) Appl. No.: 09/882,927

(22) Filed: Jun. 15, 2001

(65) Prior Publication Data

US 2002/0189791 A1 Dec. 19, 2002

(51) Int. Cl.[7] ................................................. F28F 7/00
(52) U.S. Cl. ................. 165/80.4; 165/125; 165/104.21; 165/104.26; 165/185; 257/714; 257/722; 361/699; 361/697; 361/704; 361/707; 361/709
(58) Field of Search ....................... 165/104.26, 104.33, 165/104.21, 185, 125, 80.4; 257/722, 714; 361/704, 699, 707, 709, 697

(56) References Cited

U.S. PATENT DOCUMENTS

| | | | | |
|---|---|---|---|---|
| 2,958,021 A | * | 10/1960 | Cornelison et al. | 317/234 |
| 3,965,334 A | * | 6/1976 | Asselman et al. | 219/399 |
| 4,561,040 A | * | 12/1985 | Eastman et al. | 361/385 |
| 4,633,371 A | * | 12/1986 | Nagy et al. | 361/385 |
| 5,101,640 A | * | 4/1992 | Fukushima et al. | 62/196.4 |
| 5,632,158 A | * | 5/1997 | Tajima | 62/259.2 |
| 5,660,227 A | * | 8/1997 | Crowe | 165/47 |
| 6,003,591 A | * | 12/1999 | Campbell | 165/104.26 |
| 6,019,167 A | * | 2/2000 | Bishop et al. | 165/104.33 |
| 6,410,982 B1 | * | 6/2002 | Brownell et al. | 257/714 |
| 6,510,223 B2 | * | 1/2003 | Laetsch | 379/338 |

* cited by examiner

Primary Examiner—Henry Bennett
Assistant Examiner—Nihir Patel
(74) Attorney, Agent, or Firm—Wei Te Chung

(57) ABSTRACT

A liquid cooler (1) includes a body (10) and a cover (20) attached on the body. The body includes a base (12) with a first cavity (126) accommodating liquid, a central hollow cylinder (16) having a passage (164) in communication with the first cavity, and a plurality of vertical tubes (18) in communication with the first cavity. A plurality of fins (162) extends outwardly from the hollow cylinder. The cover defines a second cavity (26) in communication with the passage and the tubes. The liquid within the first cavity is heated by a heat-generating electronic device and moved to the second cavity through the tubes. Heated liquid which has reached the second cavity flows down through the passage along an inner surface of the hollow cylinder and returns back to the first cavity. The heated liquid is cooled by the fins conducting heat away from the hollow cylinder.

1 Claim, 4 Drawing Sheets

LIQUID CIRCULATION COOLER

BACKGROUND OF THE INVENTION

1. Field of the Invention

The present invention relates to heat removal devices, and particularly to a liquid circulation cooler efficiently transferring heat from an electronic device.

2. Related Art

Computer electronic devices such as central processing units (CPUs) frequently generate large amounts of heat, which can destabilize operation and cause damage. Therefore, a cooler is generally placed in thermal contact with an electronic device to transfer heat from the electronic device through conduction.

FIG. 4 shows a conventional cooler for transferring heat from a CPU 100. The cooler comprises a heat sink 200 in thermal contact with the CPU 100, and a fan 300 fixed on the heat sink 200 to improve heat convection from the heat sink 200. The heat sink 200 is made of aluminum, and is formed by extrusion.

A ratio of a height of a heat sink to a width of spaces between adjacent fins of the heat sink is generally less than 13:1, due to inherent limitations of aluminum extrusion technology. This makes it difficult for the heat sink to meet the onerous requirements of heat transfer demanded by modern high-powered CPUs. With more and more heat being generated by modern CPUs, volume and weight of the heat sink are becoming greater and greater. Thus, it is becoming increasingly difficult to securely fix the heat sink onto a CPU. Furthermore, power must be consumed in order to operate a fan. Moreover, the fan produces noise when operating.

SUMMARY OF THE INVENTION

Accordingly, an object of the present invention is to provide a liquid circulation cooler which can efficiently transfer heat from an electronic device.

Another object of the present invention is to provide a liquid circulation cooler which has a small specific gravity.

A further object of the present invention is to provide a liquid circulation cooler which needs no power and produces no noise.

To achieve the above-mentioned objects, a liquid circulation cooler in accordance with the present invention comprises a body and a cover attached on the body. The body comprises a base having a first cavity accommodating liquid, a central hollow cylinder having a passage in communication with the first cavity, and a plurality of tubes extending upwardly from a periphery of the base and in communication with the first cavity. A plurality of fins extends outwardly from a periphery of the hollow cylinder. The cover defines a second cavity in communication with the passage and the tubes. The liquid within the first cavity is heated by a heat-generating electronic device and moved to the second cavity through the tubes by reason of temperature differences, gravitational force and capillarity of the tubes. Heated liquid which has reached the second cavity flows down through the passage along an inner surface of the hollow cylinder and returns back to the first cavity, by reason of gravitational force acting on the liquid. The heated liquid is cooled by the fins conducting heat away from the hollow cylinder when the heated liquid flows through the passage.

Other objects, advantages and novel features of the present invention will be drawn from the following detailed embodiments of the present invention with attached drawings, in which:

DESCRIPTION OF THE PREFERRED EMBODIMENTS

Figure 1:
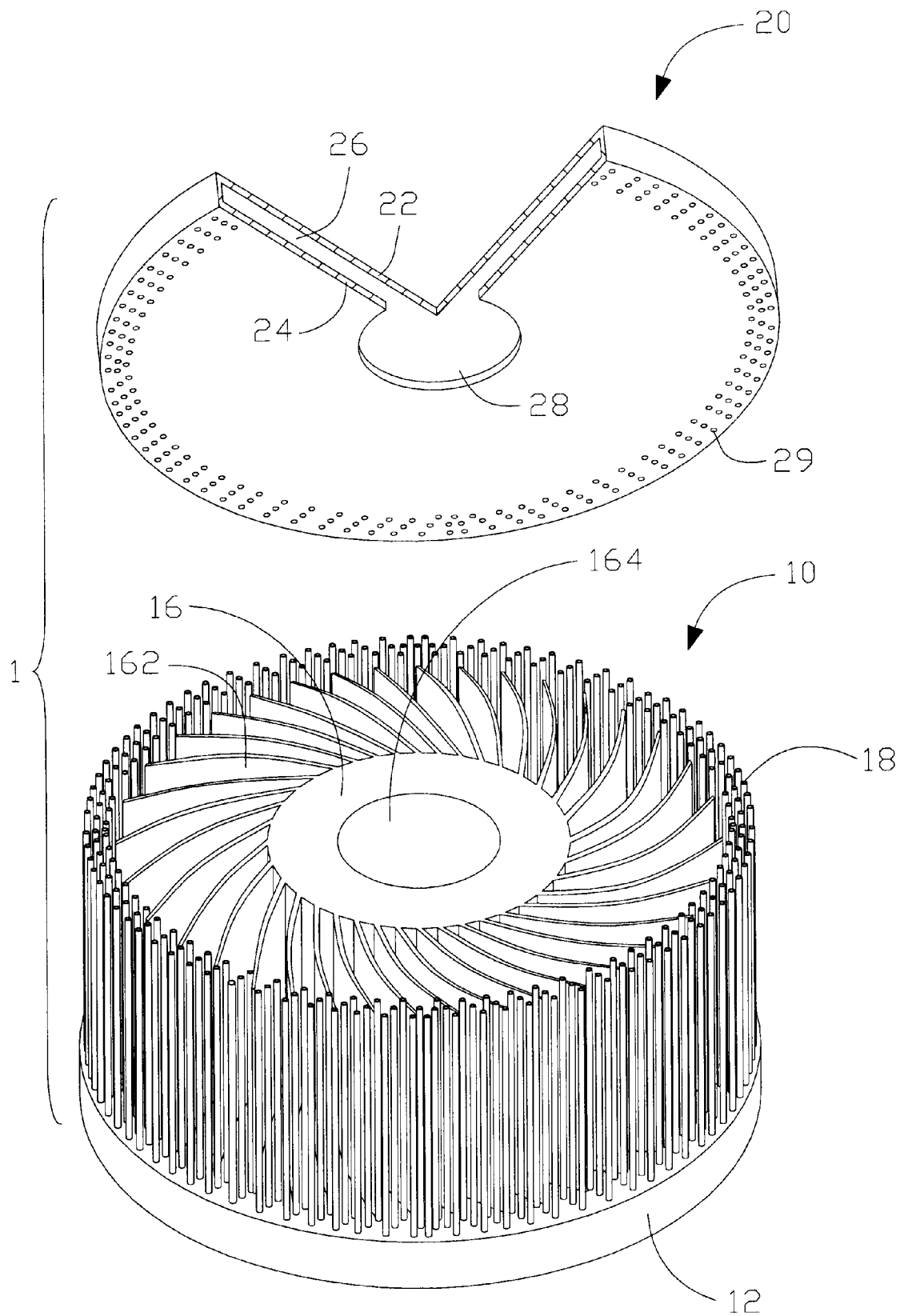
FIG. 1 is an exploded view of a liquid circulation cooler in accordance with a preferred embodiment of the present invention, with a portion of a cover of the cooler cut away.
Figure 2:
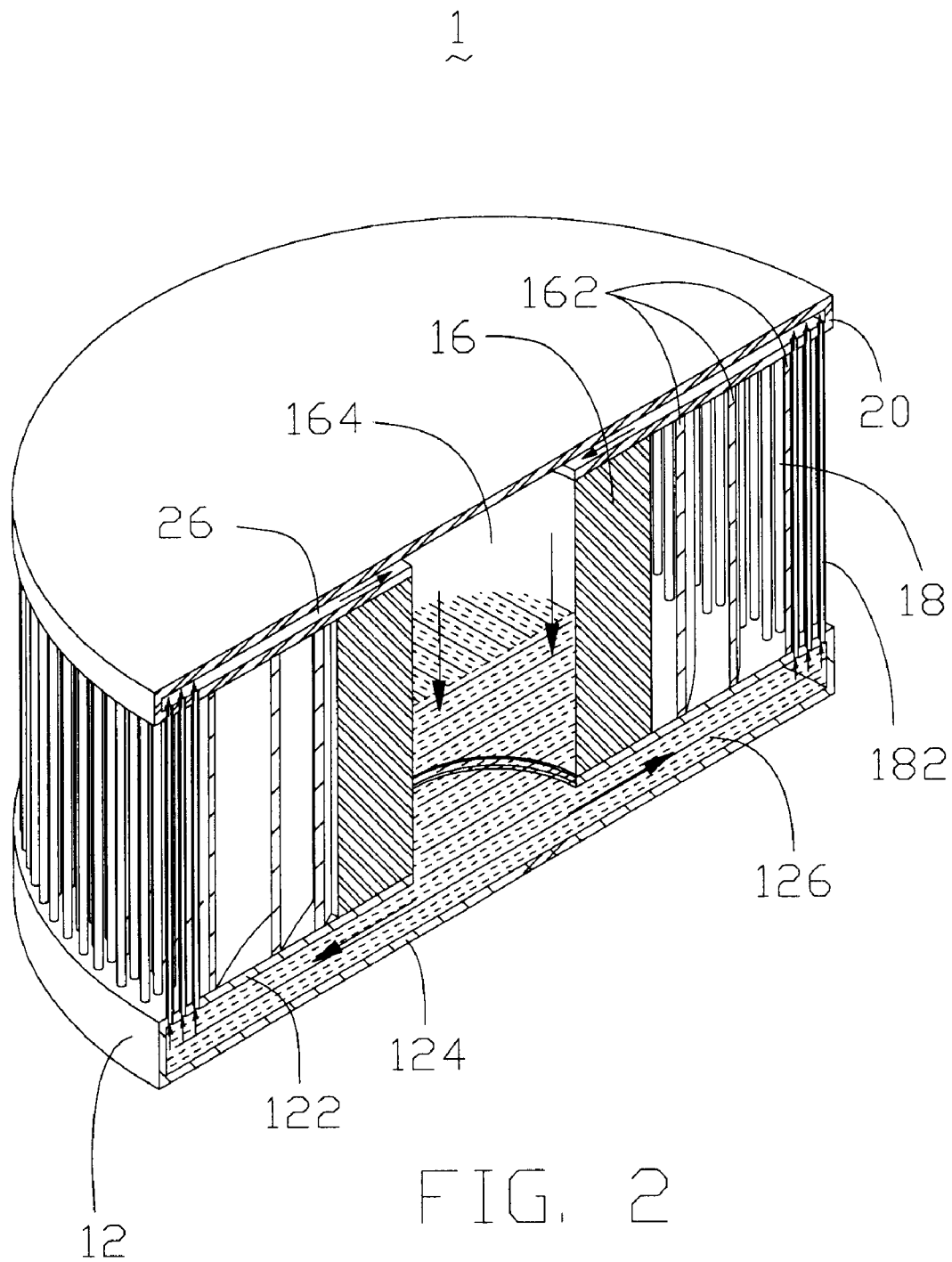
FIG. 2 is a cutaway view of the liquid circulation cooler of FIG. 1 when assembled.
Figure 3:
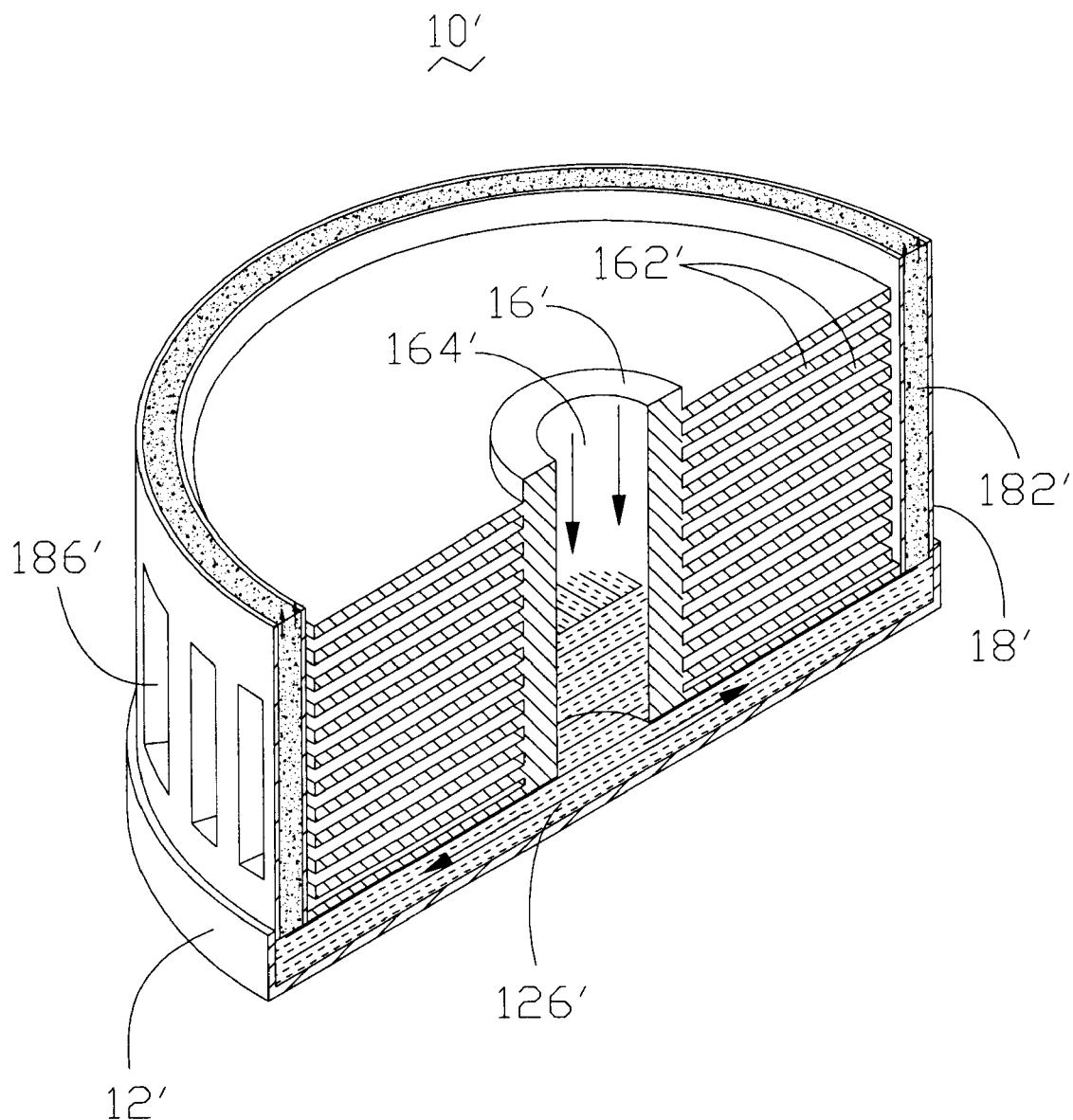
FIG. 3 is a cutaway view of a liquid circulation cooler in accordance with an alternative embodiment of the present invention.

Referring to FIGS. 1 and 2, a liquid circulation cooler 1 in accordance with a preferred embodiment of the present invention comprises a body 10 and a cover 20 attached on the body 10.

The body 10 comprises a circular base 12, a hollow cylinder 16, and a plurality of tubes 18. The base 12 has a top plate 122, and a bottom plate 124 opposite to the top plate 122. The base 12 defines a first cavity 126 between the top plate 122 and the bottom plate 124. The first cavity 126 is filled with liquid (not labeled). The hollow cylinder 16 extends upwardly from a center of the top plate 122 of the base 12. The hollow cylinder 16 is made of a good heat-conductive metallic material. A plurality of vertical arcuate fins 162 extends outwardly at uniform oblique angles from an external periphery of the hollow cylinder 16, such that the combined fins 162 and hollow cylinder 16 resemble a gas turbine with blades. A passage 164 is defined in a center of the hollow cylinder 16, in communication with the first cavity 126 of the base 12. Part of the passage 164 of the hollow cylinder 16 is filled with liquid (not labeled). The tubes 18 extend upwardly from the top plate of the base 12, encircling the fins 162. Each tube 18 defines a conduit 182 in a center thereof, in communication with the first cavity 126 of the base 12. Some capillary material (not shown) is attached on an inner surface of each tube 18.

The structure of the cover 20 is similar to that of the base 12 of the body 10. The cover 20 defines a second cavity 26 between a top wall 22 thereof and a bottom wall 24 thereof. Some capillary material (not shown) is attached on an inner surface of the second cavity 26. An opening 28 is defined in the bottom wall 24, corresponding to the passage 164 of the body 10. A plurality of holes 29 is defined in the bottom wall 24, in communication with the second cavity 26. The holes 29 respectively correspond to the tubes 18 of the body 10.

In assembly, the cover 20 is attached on the body 10. Each tube 18 of the body 10 is inserted into a corresponding hole 29 of the cover 20. The opening 28 of the cover 20 is in communication with the passage 164 of the body 10.

In operation, the liquid circulation cooler 1 is attached on a heat-generating electrical component (not shown), with the bottom plate 124 of the base 12 in good thermal contact with the electrical component. The electrical component typically generates most heat at a central portion thereof. Liquid within the first cavity 126 of the base 12 is heated by the electrical component. The heated liquid flows outwardly from a center of the first cavity 126 to a circumferential periphery of the first cavity 126, by reason of a temperature difference between the said center and said periphery and by reason of downward pressure exerted by the liquid within the passage 164. The heated liquid then moves upwardly through the conduits 182 of the tubes 18 to enter a circumferential periphery of the second cavity 26 of the cover 20, by reason of capillarity of the tubes 18. The heated liquid within the circumferential periphery of the second cavity 26 then flows to the opening 28 of the second cavity 26, by reason of capillarity of the capillary material within the second cavity 26. The heated liquid then flows down through the passage 164 along an inner surface of the hollow cylinder 16 to return back to the first cavity 126 of the base 12, by reason of gravitational force acting on the heated liquid itself. Thus a circulatory course is established between the base 12, the tubes 18, the cover 20 and the hollow cylinder 16. The heated liquid is cooled by the fins 162 conducting heat away from the hollow cylinder 16 when the heated liquid flows through the passage 164.

Figure 4:
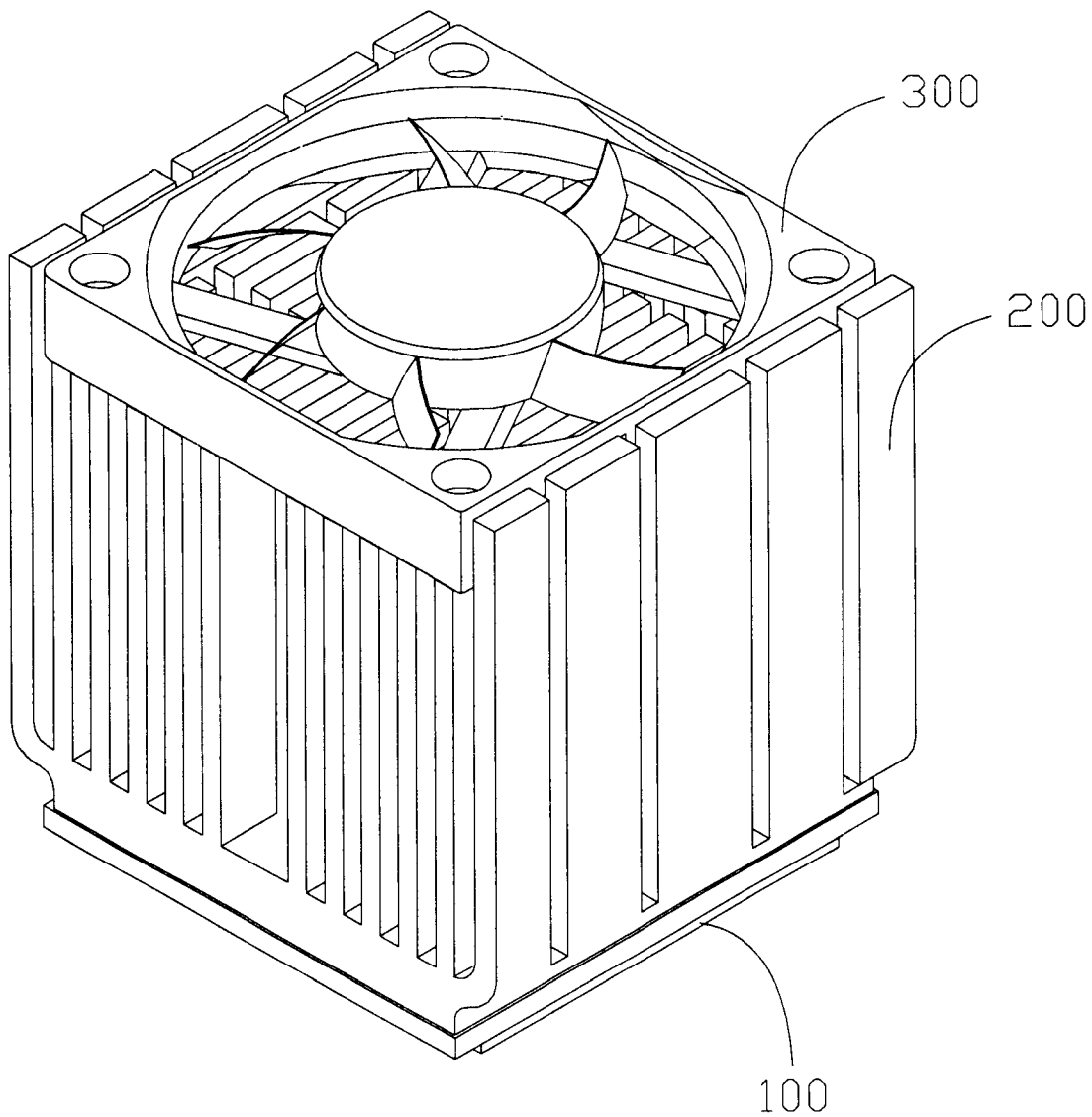
FIG. 4 is a perspective view of a conventional cooler.

Referring to FIG. 4, a body 10' of a liquid circulation cooler in accordance with an alternative embodiment of the present invention comprises a base 12' with a first cavity 126', a hollow cylinder 16' having a passage 164' defined therein, and a hollow circumferential wall 18' having a channel 182' defined therein. A plurality of parallel horizontal annular fins 162' adjoins and surrounds an external periphery of the hollow cylinder 16'. A plurality of windows 186' is defined in a periphery of the hollow circumferential wall 18', for facilitating heat dissipation of the fins 162'. Some capillary material (not labeled) is attached on an inner surface of the hollow circumferential wall 18'. A circulatory course is established between the base 12', the hollow circumferential wall 18', a cover (not shown) and the hollow cylinder 16'. The principles of operation of the liquid circulation cooler in accordance with the alternative embodiment of the present invention are similar to those of the cooler 1 of the preferred embodiment of the present invention, as described above.

In the present invention, the heated liquid flows in a circulatory course by reason of temperature differences, capillarity, and gravitational force. Thus no external power source is required. Furthermore, the base 12/12' and the hollow cylinder 16/16' of the present invention are hollow. Liquid within the base 12/12' and the hollow cylinder 16/16' is lighter than solid metal. Thus the weight of the liquid circulation cooler is significantly less than that of comparable conventional coolers. In addition, no fan is used in the liquid circulation cooler of the present invention. It operates noiselessly.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A heat sink device comprising:

a base defining a bottom surface for heat conductively contacting with an electronic component generating heat during operation, said base defining therein a first cavity horizontally dimensioned little bit smaller than the base;

a cover spatially disposed above and aligned with the base with a space therebetween, said cover being horizontally dimensioned similar to said base, said cover defining therein a second cavity horizontally dimensioned little bit smaller than the cover;

first means formed in a periphery of the space and second means formed in a center of the space both to connect said cover and said base and also communicate the first cavity and the second cavity;

liquid circulating from the first cavity, the first means, the second cavity and the second means and back to the first cavity; and fins disposed among the cover, the base, the first means and the second means for air flow heat transmission.

\* \* \* \* \*